United States Patent [19]

Castro et al.

[11] Patent Number: 5,378,508
[45] Date of Patent: Jan. 3, 1995

[54] LASER DIRECT WRITING

[75] Inventors: Anthony J. Castro, San Francisco, Calif.; Richard P. Van Duyne, Wilmette, Ill.; King C. Sheng, Troy, N.Y.; Robert J. Bianchini, Lakeland, Fla.; William J. Parr, Hopewell Junction, N.Y.; Ralph Franklin, Danbury, Conn.; Michael J. Natan, State College, Pa.

[73] Assignees: Akzo Nobel n.v., Arnhem, Netherlands; Northwestern University, Evanston, Ill.

[21] Appl. No.: 861,697

[22] Filed: Apr. 1, 1992
(Under 37 CFR 1.47)

[51] Int. Cl.⁶ .......................... B05D 3/06; B05D 5/12
[52] U.S. Cl. ..................... 427/556; 427/581; 427/597; 427/96
[58] Field of Search ............. 427/556, 581, 597, 96, 427/98

[56] References Cited

U.S. PATENT DOCUMENTS

| | | | |
|---|---|---|---|
| 3,451,813 | 6/1969 | Kinney et al. | 96/36.2 |
| 3,484,263 | 12/1969 | Kushihashi et al. | 427/581 |
| 4,511,595 | 4/1985 | Inoue | 427/581 |
| 4,526,807 | 7/1985 | Auerbach | 427/53.1 |
| 4,578,155 | 3/1986 | Halliwell et al. | 204/18 |
| 4,614,837 | 9/1986 | Kane et al. | 174/68.5 |
| 4,636,403 | 1/1987 | Fisanick et al. | 427/53.1 |
| 4,790,912 | 12/1988 | Holtzman et al. | 204/15 |
| 5,059,449 | 10/1991 | van der Putten et al. | 427/581 |
| 5,100,693 | 3/1992 | Eisch et al. | 427/581 |
| 5,260,108 | 11/1993 | Braren et al. | 427/581 |
| 5,269,838 | 12/1993 | Inoue et al. | 427/98 |
| 5,281,447 | 1/1994 | Brady et al. | 427/98 |
| 5,314,725 | 5/1994 | Morishita | 427/556 |

FOREIGN PATENT DOCUMENTS

| | | | |
|---|---|---|---|
| 81889 | 6/1983 | European Pat. Off. | 427/581 |
| 0280918 | 7/1988 | European Pat. Off. | |
| 0297677 | 4/1989 | European Pat. Off. | |

OTHER PUBLICATIONS

Japanese abstract of JP-A-72/21569 of Jun. 17, 1972 from Derwent abstract 40748t.
Japanese abstract JP-A-88/125,605 of May 28, 1988 from Derwent abstract 88-187,417.
Soviet Union abstract SU-A-362,070 of Feb. 27, 1973 from Derwent abstract 49584u.
"Surface Raman Spectroscopy as an In-Situ Probe of Laser Microchemical Processes", Jan Duyne et al., IEEE Circuits and Devices Magazine, Jan. 1986, pp. 61-65.

Primary Examiner—Marianne Padgett
Attorney, Agent, or Firm—Louis A. Morris

[57] ABSTRACT

A method for providing a conductive metal deposit on the surface of a dielectric substrate by applying a composition comprising a mixture of a salt and amine or amide compound to the substrate and subjecting the composition to a continuous wavelength laser beam.

14 Claims, No Drawings

LASER DIRECT WRITING

FIELD OF THE INVENTION

The present invention relates to the providing of conductive metal deposits on substrates, particularly dielectric substrates.

BACKGROUND OF THE INVENTION

The metallization of dielectric substrates is well established in the art, and is performed by methods such as electrodeposition, electroless deposition, vacuum metallizing and cathode sputtering. In a substractive process using these methods in the manufacture of printed circuit boards, in a first step the entire surface of the substrate board is metallized, whereupon a photoresist is applied and patterned, exposing the metal surface from which the metal is to be removed, after which the exposed surface metal is etched away. In contrast to such substractive methods, additive printed circuit manufacture provides for deposition of the metal at the pattern areas only, thus avoiding waste of metal material.

The most versatile metallization methods can be used both for substractive and additive printed circuit formation. One such method comprises the use of conductive pastes containing conductive metal powder, binder and liquid organic vehicle for adjusting viscosity. Such pastes are applied to the substrate in a desired pattern and fixed by curing the binder. The presence of binder in the cured metallic surface layer reduces the conductivity. Other methods have been proposed omitting the use of a binder, wherein a metal powder is evenly spread on the substrate surface, optionally using a liquid volatile vehicle, and subsequently compressed into the substrate surface layer. Since the substrate is required to be deformable, such methods cannot be used for all types of substrates. Moreover, commercially available powders of the cheaper and economically more attractive metals, such as copper and nickel, usually are covered by an oxide layer and, therefore, cannot directly be used. Thus, according to U.S. Pat. No. 4,614,837, to Kane et al., issued Sep. 30, 1986, prior treatment of the oxide-coated metal powders with a hydrogen reducing agent is required to accomplish the metal powder compression method described above. EP-A-297,677 of Parr et al., published Jan. 4, 1989, describes a method of forming a conductive metal layer on a substrate by depositing a layer of copper or nickel particles on a temporarily deformable substrate, contacting these metal particles with a specific kind of developing agent, and then subjecting the metal particles and developing agent to heat, in the substantial absence of oxygen, for a time duration sufficient to improve the conductivity of the metal layer. The metal particles as initially applied in Parr et al. can have an oxide layer on them without the requirement of treatment with hydrogen prior to use.

EP-A-280,918 of Mehherjee et al., published Sep. 7, 1988, discloses in-situ decomposition of organometallic compounds at the surface to be metallized. However, this method uses a binder, and the precipitated metal itself does not provide a conductive layer, but rather serves as catalyst for further traditional plating steps.

According to JP-A-72/21569 (Derwent abstract 40748t) an alumina substrate is precoated with a copper sulfide kaolin composition, whereupon a silver carbonate layer is applied, which is reduced by heating at temperatures above 700° C. in a reducing atmosphere. The high temperature requirement precludes the use of the method for resin substrates. SU-A-362,070 (Derwent abstract 49584u) discloses the metallization of dielectrics by chemical deposition of copper metal using an aqueous solution of metal salts and reducing agents.

JP-A-88/125,605 (Derwent abstract 88-187,417) discloses the production of fine metal powders by gradually mixing and decomposing a non-aqueous solution of a nitrate, sulfate or chloride of certain metals with a non-aqueous solution or dispersion of a reducing agent, such as hydrazine or a mixture of hydrazine with at least one of boron hydride, formalin, sodium pyrophosphite and triethanolamine.

Copending U.S. patent application Ser. No. 447,779, filed Dec. 8, 1989, discloses a method for effecting reductive deposition of a metallic coating onto a substrate by heating a mixture of a metal salt or metal compound and amine compound having at least one functional substituent group capable of coordination to and reduction of metal ions, the amine nitrogen and the functional substituent being separated by from two to six other atoms. Although the method of this reference produces excellent results, it does have limitations such as with respect to speed, potential for automation, and production of highly resolved patterns.

U.S. Pat. No. 4,790,912 (Holtzman et al.) discloses selectively depositing metals on a non-conductive substrate by charging a catalyst on the substrate with hydrogen electrolytically generated from a protic bath and contacting the catalyst/hydrogen combination with a solution of metal salt. There are amine adjuvants (promoters) that may be used in the electrical plating bath of Holtzman et al., but they do not effect reductive depositions.

There is also considerable prior art that discloses the use of photochemical energy as provided by a diffuse light source or coherent, high energy laser beam to effect deposition of metals on a substrate.

U.S. Pat. No. 4,526,807 to Auerbach, issued Jul. 2, 1985, discloses a method of depositing conductive elemental or metalloid spots on a non-conductive substrate. At least one reducible metal or metalloid compound is placed in a solution or dispersion comprising an oxidizable organic matrix. The organic matrix typically comprises a polyamic acid or a polyimide. The substrate is coated with the solution or dispersion, and the coated substrate is then contacted with a beam of localized radiation absorbable by the coated substrate, thereby causing reduction of the metal or metalloid to the elemental state. The organic matrix is described generally as comprising at least one nitrogen compound, typically containing amine, amide or similar functionalities. When the metal to be deposited is subject to oxidation under ambient conditions, e.g. copper, Auerbach recommends an inert or reducing atmosphere.

U.S. Pat. No. 3,451,813 to Kinney et al. describes the use of high intensity photoflashes to cause formation of conductive deposits from a variety of metal salts mixed with a radiation sensitive pyrolizable organic resin. There is no mention of amines.

U.S. Pat. No. 4,636,403 to Fisanick et al. describes the use of laser energy to repair metallic and non-metallic photomasks via deposition of metal from a metal-organic compound. This reference does not suggest use of metal salt-amine mixtures, but employs metal-organic compounds such as a gold terpene mercaptide. Because of the nature of the metal-organic compounds used, the laser output power must be ramped up rather than pulsed.

U.S. Pat. No. 4,578,155 to Halliwell et al. describes electroless plating by submerging the substrate in the plating solution and passing a laser beam through the solution to cause a metal deposit to be made on the substrate. The substrate must also remain immersed in the solution during the deposition process.

SUMMARY OF THE INVENTION

The primary objective of the present invention is to provide a convenient method whereby coherent energy from a laser light source is used for metallizing a substrate surface for the manufacture and repair of printed circuit boards.

It is a further object of the invention to provide a method of producing metallic surface layers or patterns onto substrates, which are well adhered and are conductive. It is also an object of the invention to provide a method for metallizing dielectric substrates, which will find advantageous application in the fabrication of capacitors, the repair of printed circuit boards, or other areas of the electronics industry.

Other objectives are to provide details concerning compositions of the materials on which a laser beam may act as well as processing conditions and laser characteristics.

Accordingly, the present invention comprises a method for providing a conductive metal deposit on the surface of a substrate, the method comprising the steps of:

a) applying a composition to a substrate surface, wherein said composition comprises
   (i) a salt or compound of a metal element having a standard reduction potential in the range of from about $-0.3$ to about $+1.7$ V and,
   (ii) an amine or amide compound having at least one functional substituent group capable of coordination to and reduction of metal ions, said amine nitrogen atom and said functional substituent being separated by from two to six other atoms, or
   (iii) an intermediate reaction product of (i) and (ii); and b) subjecting that part of the applied composition where the deposit on the surface of the substrate is desired at ambient conditions to a continuous wavelength laser beam of a wavelength from about 200 to about 1,000 nanometers and power of from about 5 to about 1,000 milliwatts for a sufficient time to effect reductive deposition of said metal element.

DETAILED DESCRIPTION OF THE INVENTION

According to the invention, a metallic coating is deposited onto at least part of the surface of a substrate by first applying to the substrate a uniform coating from a homogenous solution which comprises (i) a salt or compound of a metal element having a standard reduction potential in the range of from about $-0.3$ to about $+1.7$ V, and (ii) an amine compound developer having at least one functional substituent group capable of coordination to and reduction of metal ions, the amine nitrogen atom and the functional substituent being separated by from two to six other atoms. The components (i) and (ii) need not be present as separate entities but may be combined by prereaction prior to the laser-induced reduction and deposition of the metal element.

Suitable metals, of which the salts or compounds can be used and from which metallic coating can be obtained according to the invention, should be relatively easily reducible as reflected by their position in the electro-chemical series. More particularly, suitable methods should have a standard reduction potential in the range of from $-0.3$ to $+1.7$ V for their basic reduction reaction $M^{+n} + ne^- \longleftrightarrow M$, with M representing the metal element concerned and n its common oxidation state(s). Accordingly, metal elements for use in the invention can range from gold ($Au^+ + e^- \longleftrightarrow Au$ at $+1.68$ V) to cobalt ($Co^{2+} + 2e^- \longleftrightarrow Co$ at $-0.28$ V). Particular suitable metals include gold, iridium, platinum, palladium, mercury, silver, rhodium, copper, lead, nickel and cobalt, with gold, palladium, silver, copper and nickel being preferred in view of their desirable properties in electronic applications.

In principle, any salt or compound of the above metals can be used in the invention, including salts formed by the metallic cation and common anions such as halides, sulfates, carbonates, hydroxides and carboxylates, and nonionic compounds, such as metal oxides wherein the metal atom has a formal positive valency. It was found that the nature of the anion to some extent influences the adhesion and quality of the metallic layer to the substrate. Accordingly, the invention provides the additional advantage of allowing for simple variation of the metal salt used for obtaining the optimum adhesion, conductivity and laser conditions for each substrate. However, it should be realized that some metal salts or compounds upon reduction may leave undesired contaminating side products, such as halide or sulfate anions, in the metallic layer produced. Accordingly, in the present invention, metal carbonates, hydroxides, carboxylates and metal oxides are the preferred components (i).

The second essential component of the composition in the invention is an amine compound (developer), being defined herein as an organic compound being derivable from ammonia by replacement of one or more hydrogens by organic groups. At least one of these organic groups is required to carry a functional substituent capable of coordination to and reduction of metal ions. Suitable functional substituents include, for example, hydroxy, amino, and carbonyl containing substituents. For the functional substituent to optimally interact with the metal ion, it should preferably be separated from the nitrogen atom by a distance of from two to six other atoms, usually carbon atoms, along the interconnecting chain. More rigid structures, such as para-substituted aromate, appear to diminish the interacting capability of the functional substituent. Preferably the group carrying the functional substituent is an aliphatic group. Amine compounds having a hydroxyalkyl group are readily available and can be prepared, inter alia, by alkoxylation of any primary or secondary amine.

According to a preferred embodiment of the invention, the amine compound (ii) further carries at least one further group which is a linear or branched alkyl, alkenyl, or acyl group having from 8 to 20 carbon atoms. Representative amine compounds for use in the present method include N-oleyl, N-stearyl, N-coco or N-tallow ethylene diamine; N-oleyl, N-stearyl, N-coco or N-tallow propylene diamine; tetramethylethylenediamine; 3-amino propanol; mono-, di-, or triethanol amine; diethylenetriamine; 2-(benzylimino) ethanol; 2-(cyclohexylimino) ethanol; and 2-(aminomethyl) phenol.

Preferred developers are bis-(2-hydroxyalkyl)$C_{8-20}$ alk(en)yl amines and amides, such as bis-(2-hydroxyethyl) lauryl amine, N,N-bis-(2-hydroxyethyl) lauramide, N-9-octadecanyl-1,3-propane diamine, and bis-2(hydroxyethyl)tallow amine.

In the method of the invention the components (i) and (ii) need not be combined prior to application to and contact with the substrate surface provided that both are present at the surface when the laser induced reduction is applied. So, a substrate may be coated with a film of the amine compound (ii) and subsequently a solution of the metal salt or compound may be applied onto this film, or the two components may be applied in the reverse order. More conveniently, a composition containing both components is prepared in advance.

Furthermore, both components (i) and (ii) need not be present as separate entities, and may be combined in advance provided that the laser induced reduction to the metallic state is only applied when the composition is in contact with the substrate surface. Whether starting from the salt/amine compound combination or from their intermediates, the final photothermal reduction-inducing process will provide a well adhered metallic deposition.

The composition in the present method can be in the form of a low viscosity liquid depending on the elected way of application to the substrate. Thin liquid compositions can be applied to the substrate by simple submersion of the substrate in the composition followed by heating to the required temperature to assure a uniform coating. Preferably, the present compositions are used in the form of a liquid, allowing for higher concentration of metal layer forming ingredients and/or convenient application methods such as brushing, dipping, spin coating, etc.

The preferred developers (i) themselves being liquids or low-melting solids, neat mixtures of the components (i) and (ii) may already have the desired viscosity. If necessary, the viscosity can be adjusted by incorporation of a liquid organic vehicle. The vehicle may be a hydroxylic compound having one or more hydroxy groups, and it may function as an additional reducing agent. Such vehicles include water, methanol, ethanol, isopropanol, glycerol, ethylene glycol and polyethylene glycols. Other additional reducing agents, such as phenolics, may be included in the composition. The compositions may further comprise additives for modifying the rheology.

The relative amounts of components (i) and (ii) should be such that full reduction of the metal salt or compound is achievable. Otherwise, the relative amounts may be widely varied in order to obtain the desired viscosity and handling characteristics. The composition should be applied to the substrate as a thin film or finely dispersed paste which will allow unobstructed passage of the laser light source.

In principle, any substrate can be metallized by the method of the invention. Substrates being particularly contemplated are those finding utility in electronic materials manufacturing, and include ceramics, such as alumina, barium titanate and silicon carbide, ceramic greenware, synthetic resins, such as polyimide and polybutylene terephthalate, and others, such as glass, silicon wafer or glass filed epoxy board. The substrate may be of any desired shape, for example in the form of sheets, chips, rods, fibers, films etc. The composition containing components (i) and (ii) may be applied to the surface of the substrates as available. Some substrates may require pre-treatment of their surface for enhancing the adhesion of the metallic layer to be formed. Such pre-treatments are well-known for the substrates involved and extensively performed in preparation for the known deposition methods.

Laser direct writing is particularly desirable to the electronics industry, as compared to methods such as thermally induced deposition as discussed above, in that it enables speed, a potential for automation, production of highly resolved patterns, repair of expensive printed circuits and good adhesion to a variety of substrates. Laser writing achieves circuits having resolution in the area of one micron, a degree of precision not realized with standard photolithography. The unexpected discovery made in the course of development of the present invention was that via the very particular combination of metal salt or compound, amine or amide compound and laser beam characteristics as defined above direct laser writing may be effected at ambient conditions even in the course of depositing a relatively reactive and easily oxidized metal such as copper. By "ambient conditions" it is meant that the laser beam is employed without having to provide an inert or reducing atmosphere for the workpiece.

Thus, the requirements of the present invention are in contradistinction to teachings in the art such as Auerbach which would lead one skilled in the art to believe ambient conditions would not be appropriate when using a laser beam to effect the deposition of a relatively reactive metal. With typical prior art methods laser writing will produce "seed sites" of metal oxides unless an artificial inert or reducing atmosphere is created. These seed sites must then be further developed to obtain the free conductive metal.

Without being limited to any theory, it is believed that the relatively low power lasers used by the present method are effective because of an apparent synergy between the very specific developers, metal salts or salt compounds and laser beam characteristics to which the invention is limited (thus low cost diode lasers may be appropriate). This synergy is manifested by a very low energy photo-chemical intermediate reaction which forms a metallic complex that will decompose and deposit a free metal (rather than an oxide) upon absorbing a small amount of thermal energy from the laser beam.

The present method is intended to be used for directly depositing metallic patterns onto the surface of a substrate. So, a composition may be applied to the substrate surface according to a desired pattern and the assembly subjected to laser writing followed by the washing and drying steps. Alternatively, a selective mask may be placed upon a substrate, and the depressed areas on the mask may be filled with the present composition. After treating of the metal deposition, the mask may be removed or be retained permanently. Furthermore, the composition may be applied to the entire surface of the substrate, whereupon the laser beam is applied to the areas where metal deposition is desired. In the subsequent washing step the composition is removed from the non-reacted areas leaving the desired metal pattern. Particularly advantageous is the deposition of silver as the first layer, followed by a single deposition of any of the other metals, to result in highly conductive layers.

Preferred embodiments of the present invention are illustrated by the following examples. In some examples a dielectric substrate was coated with the developing complex solution by applying a concentrated mixture as the sample was spun in a coating apparatus. Under ambient laboratory conditions, the sample was then placed on a microscope stage which was equipped with two stepping motors that were interfaced to a Newport Electronics model 855c x,y-stage controller. Using a series of mirrors, beam shaping optics and filters, laser light was directed through the optics of the direct write microscope so that the laser beam was focused through the microscope, which was equipped with a 20 power objective, and on to the surface of the substrate at the stage. A video monitor interfaced with the apparatus allowed real time magnified imaging of the microfabrication process. A detailed description of the direct write apparatus has been given elsewhere (IEEE Circuits and Devices Magazine, January 1986, 61) incorporated herein by reference.

In order to assess the quality of the metallic deposit obtained from the direct write process, electrical conductivity was measured using the test procedures described below.

Conductivity: bulk conductivity of the metal deposits was obtained by connecting two copper metal leads to the deposit using a commercially available silver based epoxy paint which was cured for twelve hours at room temperature. Using a high impedance voltmeter, the copper leads were connected to the instrument and the resistance of the deposit was recorded. In several cases a combination of the deposit's geometry, as obtained from profilometry measurements, and electrical resistance allowed calculation of conductance.

Other tests were performed to assess the deposit's physical qualities and elemental composition. These are now described.

1. Adhesion tests
   A. Methanol wash test: a steady stream of reagent grade methyl alcohol from a laboratory spray bottle was directed at the micro deposit from a distance of approximately one foot (30 cm) for one minute. No removal of the laser written deposit by the alcohol constituted a passing of the test.
   B. Scotch tape adhesion test: a piece of scotch tape is firmly pressed over the surface of the substrate and then peeled away. The deposit should not be removed.
2. Elemental composition: elemental composition was determined using surface spectroscopy techniques which are well established in the industry. ESCA, AUGER, and EDAX spectroscopy were used to determine the presence of elemental metal on the substrate.
3. Reflectivity assessment: optical and scanning electron microscopy were used to assess the reflectivity, continuity and overall quality of the deposit. A highly reflective and continuous deposit is indicative of elemental metal formation.
4. Laser Conditions: A Spectra Physics continuous wave krypton laser operating at a frequency of 647.1 nanometers was employed in all examples unless otherwise specified.

EXAMPLE I

A. A piece of 96% alumina ceramic (ex. Coors type) of 2 cm×2 cm dimensions was cleaned by placing in a beaker containing 150-200 mls of neat reagent grade hexane and immersing the container in an ultrasonic bath for 5-10 minutes. This was followed by a second ultrasonic cleaning in methanol. The substrate was removed from the solvent and allowed to air dry. A saturated solution of copper (II) formate (Pfalz and Bauer) dissolved in 1 molar acetic acid, was prepared and diluted 1:1 with triply distilled water. An homogenous application solution was prepared by mixing 0.2 ml of copper solution with an equal volume of a solution of 0.6 g Duomeen-OL, an aliphatic diamine, dissolved in 20 ml methanol. Approximately 0.5 ml of the application solution was dropped on to the dried substrate, which had been placed on a glass microscope slide, using a Hamilton repeater pipette from a distance of 4–5 mm above the substrate. The wetted substrate was then placed under an infrared heat lamp (250 w) located 24 inches (61 cm) above the benchtop, and the sample was allowed to dry. As the solution dried (@10–15 min), a spatially uniform light green film, which was evenly distributed, formed over the surface. In this example a continuous wave krypton laser operating at a frequency of 647.1 nm was used to deposit a raster pattern of metal using a incident laser power of 50 milliwatts and a scan speed of 50 microns/second. By repeated scans using a line spacing of 20 microns between lines, a 1 cm×1 cm continuous bronze color, highly reflective deposit with line widths of 10–12 microns was formed in about 30 minutes. Upon completion of the deposition process, unreacted metal complex was removed by directing a stream of reagent grade methyl alcohol from a spray bottle at the sample. ESCA spectroscopy showed the deposit to contain copper. The deposit was well adhered to the substrate and in addition to surviving the methyl alcohol wash test was not removed by scotch tape.

B. 0.2 mL of a saturated solution of copper formate dissolved in 1 molar acetic acid was mixed with 0.2 mL of methyl alcohol and dropped on to a 2 cm×2 cm sample of alumina ceramic (ex. Coors type) which had been cleaned by the sonication procedure described above. The solution was allowed to air dry under a heat lamp at a distance of 24 inches (61 cm) to give a uniform green film. As in the example above, the sample was placed on the microscope stage and exposed to the laser light using the same conditions to form a 1 cm×1 cm pattern. A pale yellow deposit was formed. Upon washing with methanol, some of the deposit was removed. The deposit did not survive the scotch tape adhesion test. Surface analysis by ESCA spectroscopy indicated that significant quantities of the deposit consisted of copper oxides.

C. An homogenous working solution was prepared as described in Example IA. It was drop coated on to a piece of cleaned 2 cm×2 cm alumina ceramic and allowed to dry under a heat lamp. A uniform light green film formed. Irradiation with the laser using the conditions in IA resulted in the formation of several metallic looking lines of 10–12 microns in width. Unreacted metal complex was washed away with methanol and two copper leads were bonded to the deposit with silver epoxy paint. Using a high resistance voltmeter this sample gave a measured resistance of 50 ohms ($1.6 \times 10^{-4}$ ohm-centimeters).

D. In this example 0.2 mL of a saturated solution of copper formate dissolved in 1 molar acetic acid was mixed with 0.2 mL of methyl alcohol and dropped on to a 2 cm×2 cm sample of alumina ceramic (ex. Coors type) which had been cleaned by the sonication procedure described above. The solution was allowed to air dry under a heat lamp at a distance of 24 inches (61 cm) to give a uniform green film. Irradiation with the laser under the same conditions as above produced several pale yellow lines which were partially removed by washing with methanol. Two copper leads were bonded across the deposit with silver epoxy paint. The deposit was not conductive.

EXAMPLE II

A. In this example 0.2 mL of a solution consisting of nickel acetate tetrahydrate (Aldrich Chemical Co.) saturated in 1 molar acetic acid was mixed with 0.4 mL of a solution of 50% Lauridit KD and 50% triethylene glycol to give a viscous, homogenous light green solution of nickel complex. 0.2 ml of the nickel complex solution was dropped on to a 2 cm×2 cm piece of alumina ceramic, which had been cleaned using the sonication procedure described in Example I. The coated substrate was air dried under a heat lamp to yield a uniform light green film. The sample was placed on a microscope stage and exposed to the laser as in Example I. An incident laser power of 100 milliwatts and a scan speed of 25 microns/second were used to obtain a highly reflective, well adhered, continuous black metallic deposit, which survived the methyl alcohol wash test.

B. 0.2 mL of a saturated solution of nickel acetate dihydrate dissolved in 1 molar acetic acid was mixed with 0.2 mL of methyl alcohol and drop coated on to a cleaned 2 cm×2 cm piece of alumina ceramic and dried under a heat lamp to give a uniform green film. The sample was placed on the microscope stage and irradiated with the laser using the same conditions as in Example IIA. A non-continuous deposit of low reflectivity was obtained. While washing away unreacted film with methanol, the poorly adhered, dull black, grainy deposit was removed.

EXAMPLE III

A. In this example a solution of copper formate saturated in 1 molar acetic acid was diluted 2:1 with methyl alcohol and dropped on to the surface of a borosilicate glass slide cover which had been cleaned by sonication in methyl alcohol and dried in air. The coating was allowed to dry overnight under ambient conditions to yield a spatially uniform blue-green film. Then, a 9% solution of Lauridit KD dissolved in glycerol (Lauridit KDG) was applied on top of the copper film using a disposable pipette and spread evenly over the surface with a glass slide to give a uniform liquid film. Using the direct write apparatus, and with the laser operating at 647.1 nm with 30 milliwatts of incident power and a scan speed of 100 microns/second, a highly reflective, continuous bronze color deposit was obtained upon exposure to the laser. The deposit survived the methanol wash test and exhibited a measured resistance of 113 ohms.

B. A solution of copper formate saturated in 1 molar acetic acid and diluted 2:1 with methanol was dropped on to the surface of a borosilicate glass slide which had been cleaned using the procedure in Example IIIA. The coating was allowed to dry overnight under ambient conditions to yield a spatially uniform blue-green film. Irradiation with the laser using the conditions in the example above yielded a slightly reflective brown deposit. The deposit was not continuous and not conductive. A portion of the deposit was removed by washing with a stream of methanol.

EXAMPLE IV

A. A solution of copper neodecanoate (Mooney Chemicals, 12% copper) dissolved in mineral spirits was mixed with a solution of 50% Lauridit KDG in triethylene glycol in a 1:1 weight ratio. Four drops of a deep green solution were spin coated on to a piece of 96% alumina ceramic, which had been cleaned by soaking in methylene chloride, using a Zorelco spin coater operating at 1500 rpm. The sample was spun for 2 minutes and then dried overnight at room temperature in a hood. A slightly tacky, deep green spatially uniform film formed over the surface. The sample was placed in the laser's path and irradiated with an incident power of 150, 100 and 75 milliwatts at a scan speed of 50 and 100 microns/second. A shinny, continuous deposit was obtained under all conditions. The deposit survived the methanol wash test and examination under high optical magnification showed that the deposit was highly reflective.

B. A solution of copper neodecanoate (12% copper) dissolved in mineral spirits and reagent grade isopropanol were mixed in a 1:2 weight ratio and spin coated on to cleaned alumina ceramic using the conditions described in Example IVA above. The sample was dried overnight in a hood to yield a dark green tacky film. Irradiation with a laser at 150, 100 and 75 milliwatts of power gave a black deposit which did not survive the methanol wash test.

EXAMPLE V

A. A saturated solution of nickel acetylacetonate (Aldrich) was prepared by dissolving in absolute ethanol with mild heat. This was mixed with a 25% solution of Duomeen-OL dissolved in methanol in a 1:1 weight ratio to yield a light green application solution. The application solution was drop coated on to a 1 cm×1 cm piece of polyimide film (Kapton, Dupont Co.), which had been cleaned with isopropanol, and allowed to dry for 30 minutes under a heat lamp. A spatially uniform light green film resulted. The sample was placed in the laser's light path and irradiated with 30 milliwatts of incident energy and a scan speed of 100 microns/second. A shinny black deposit was obtained which survived the methanol wash and scotch tape test. Observation under high optical magnification revealed that a highly reflective continuous deposit had been formed.

B. A saturated solution of nickel acetylacetonate dissolved in ethanol was drop coated on to a 1 cm×1 cm piece of alcohol cleaned Kapton film (Dupont) and dried as described above to yield a light green film. The sample was placed in the laser light beam and irradiated with 30 milliwatts of incident radiation at a scan speed of 100 microns/second. No deposit was obtained under these conditions.

EXAMPLE VI

A. In this example basic nickel carbonate (Alpha Chemicals) was mixed with a 10 molar solution of hydrochloric acid in a 1:4 weight ratio to give a light green solution. 0.5 g of nickel solution was mixed with 1.0 g of a 25% solution of Armostat-310 diluted in isopropanol. 0.2 mL of the homogenous complex working solution was dropped on to a piece of 96% alumina ceramic, which had been cleaned with isopropanol. The sample was dried under a heat lamp for 30 minutes to yield a spatially uniform film. Irradiation with the laser at 100 milliwatts of incident power and 50 microns/second scan speed produced a shinny black deposit which survived a methanol wash. Examination under an optical microscope revealed that a highly reflective continuous deposit had been produced.

B. A 1:4 solution of nickel carbonate dissolved in 10 molar HCl was prepared in a beaker. 1.0 g of nickel solution was mixed with 1.0 g of isopropyl alcohol to give a light green solution. 0.2 mL of the working solution was dropped on to a piece of alumina ceramic which had been cleaned in alcohol. The sample was dried under a heat lamp to yield a blotchy green film. Irradiation with the laser produced a fine dull black deposit which did not survive the methanol wash.

EXAMPLE VII

A. A saturated solution of nickel acetate (Aldrich Chemical) dissolved in 1 molar acetic acid was mixed in a 2:1 weight ratio with Lauridit KDG and warmed on a hot plate to give a light green solution. The complex solution was spin coated on to a piece of cleaned alumina ceramic and allowed to dry overnight at room temperature in the hood. Irradiation with the laser set at 60 milliwatts and a scan speed of 100 microns/second resulted in a reflective grayish-black deposit which survived the methanol wash test.

B. A solution of nickel acetate saturated in 1 molar acetic acid was spin coated on to a cleaned piece of alumina ceramic and then air dried overnight in the hood. The sample was irradiated with the laser under the same conditions as described in VIIA above. No deposit was obtained.

EXAMPLE VIII

A. An homogenous solution of copper formate and Duomeen-OL was prepared as described in Example IA and drop coated on to a cleaned piece of polished single crystal (100) silicon. The sample was dried under a heat lamp for 10 minutes to give a uniform green-blue coating. Irradiation with the laser operating at 50 milliwatts of incident power and a scan speed of 50 microns/second yielded a highly reflective metallic looking deposit. The conductance was found to be $2.5 \times 10^{-4}$ ohm-centimeters.

B. A saturated solution of copper formate dissolved in 1 molar acetic acid was mixed 1:1 with methyl alcohol and drop coated on to a piece of cleaned single crystal silicon and allowed to dry under a heat lamp to yield a uniform green film. Irradiation using the same laser conditions as in Example VIIIA resulted in a slightly reflective deposit.. The deposit's resistance was found to be 7,000 ohms ($2.5 \times 10^{-2}$ ohm-centimeters).

EXAMPLE IX

A. An homogenous working solution of copper formate and Duomeen-OL was prepared as described in Example IA. The solution was drop coated on to a 2 cm×2 cm piece of polyimide film which had been cleaned by sonication in hexane and methyl alcohol and allowed to dry under a heat lamp for 10 minutes. Irradiation of the light green film at a laser power of 60 milliwatts and a scan speed of 50 microns/second yielded a reflective deposit which was well adhered to the substrate. The deposit survived washing with methyl alcohol and was not removed by scotch tape. By bonding two copper leads with silver epoxy paint to the deposit, a measured resistance of 7,000 ($1.7 \times 10^{-2}$ ohm-centimeters) ohms was obtained.

B. A saturated solution of copper formate in 1 molar acetic acid was prepared and diluted 1:1 with methyl alcohol. The light green solution was drop coated on to a piece of cleaned polyimide film and dried under a heat lamp to yield a uniform light green film. The sample was irradiated with the laser under the same conditions as in Example IXA. A dull brown deposit was obtained which was not conductive.

EXAMPLE X

A. In this example a piece of alumina ceramic was coated with silver metal using the procedure described in U.S. patent application No. 447,779. The silver coated ceramic was cleaned by sonication in methyl alcohol and then coated with the copper-Duomeen solution as described in Example IA. The coated sample was dried under a heat lamp to yield a light green film. With the laser set at an incident power of 50 milliwatts and a scan speed of 50 microns/second several 5 micron wide highly reflective bronze color lines were obtained. Upon washing with methyl alcohol, only unreacted film was removed. The deposit survived the scotch tape adhesion test.

B. In this example a piece of alumina ceramic was coated with nickel metal using the procedure described in U.S. patent application No. 447,779. The nickel coated ceramic was cleaned by sonication in methyl alcohol and then coated with the copper/Duomeen solution described in Example IA. The coated sample was dried under a heat lamp to yield a light green film. The laser was adjusted to an incident power of 50 milliwatts and a scan speed of 50 microns/second. Several 6-8 micron wide lines of a highly reflective gray-black deposit were obtained. Upon washing with methyl alcohol, only unreacted film was removed. The deposit survived the scotch tape adhesion test.

EXAMPLE XI

A. In this example a piece of alumina ceramic was prepared and coated with the copper solution described in Example IA. A titanium doped sapphire (ti:sapphire, Spectra Physics model 3900) laser was tuned to a wavelength of 800 nm and several lines were deposited on the surface. Unreacted film was removed with methyl alcohol and a highly reflective bronze deposit remained adhered to the surface.

B. A solution of nickel formate and Lauridit-KDG was prepared using the procedure described in Example VII. The green solution was drop coated on to a piece of cleaned ceramic and dried under a heat lamp to yield a uniform green film. The laser was adjusted to 676 nm and the sample was irradiated at 100 milliwatts of power and a scan speed of 25 nanometers/second. Several lines 6-8 nm in width were deposited and were not removed by washing with a strong stream of methanol.

EXAMPLE XII

In this example a piece of commercially plated alumina ceramic which contained a series of elemental copper microcircuits was obtained (i.e. a ceramic circuit board). It was cleaned by sonication in methylene chloride for 10 minutes. A copper formate/Duomeen-OL solution was prepared as described in Example IA and the substrate was coated with 50 microliters of solution and dried under a heat lamp for 10 minutes. A ti:sapphire laser was adjusted to 714.8 nm and 80 milliwatts of power and a scan speed of 35 microns/second. The sample was placed in the laser's light path and two distinct copper pads, separated by 600 microns were joined by depositing several lines of copper metal with the laser scanning between the pads. After removal of unreacted reagent with a stream of methyl alcohol, the two previously unconnected pads were tested for conductivity using a Fluke multimeter. A conductivity of 77 ohms was obtained.

The above examples provide a wealth of illustration of the effectiveness of the present invention. In particular, it is shown that direct laser writing methods not employing a developer as required by the invention will produce products that will not survive the methanol wash test or the scotch tape test and/or will not yield a conductive metal deposit.

The method of the present invention is capable of producing highly resolved parallel lines of metal on dielectric substrates with 3–50 microns spacing and thin lines of 1–20 microns width. Such method is an excellent means for repair of circuits, particularly cracks that occur in micron-sized patterns, and to obtain by bridging the cracks in the circuit with deposited metal through hole plating. The use of developer allows lower laser power to be used to obtain a conductive deposit, thus enabling the use of low cost diode lasers which greatly improves the economics of the process.

We claim:

1. A method for providing a conductive metal deposit on a substrate having a surface, the method comprising the steps of:
    a) applying a composition to said surface of said substrate as a film or paste wherein said composition comprises
        (i) a compound consisting essentially of a copper or nickel compound and,
        (ii) an amine or amide compound having a nitrogen atom and at least one functional substituent group capable of coordination to and reduction of metal ions, said nitrogen atom and said functional substituent being separated by from two to six other atoms, or
        (iii) an intermediate reaction product of (i) and (ii); and
    b) subjecting that part of the applied composition where the deposit on the surface of the substrate is desired to a continuous wavelength laser beam of a wavelength from about 200 to about 1,000 nanometers and power of from about 5 to about 150 milliwatts at ambient conditions not employing an inert or reducing atmosphere and for a sufficient time to effect reductive deposition of copper or nickel, said film being thin enough or said paste being dispersed finely enough to allow unobstructed passage of said laser beam for absorption by the composition.

2. The method of claim 1, wherein said amine or amide compound further has at least one alkyl, alkenyl or acyl group of from 8 to 20 carbon atoms.

3. The method of claim 1, wherein said functional substituent is selected from the group consisting of hydroxy, amino, and carbonyl containing substituents.

4. The method of claim 1, wherein said at least one group carrying a functional substituent is selected from the group consisting of hydroxyalkyl and aminoalkyl.

5. The method of claim 1, wherein said amine or amide compound is hydroxylated.

6. The method of claim 1, wherein said amine or amide compound is selected from the group consisting of N-9-octadecanyl-1,3-propane diamine, n,n-bis-(2-hydroxyethyl) lauramide, and bis-2(hydroxyethyl) tallow amine.

7. The method of claim 1, wherein said substrate comprises a semi-conductor or a dielectric substrate selected from the group consisting of ceramics and polymers.

8. The method of claim 1, wherein said substrate comprises a dielectric substrate selected from the group consisting of glass, alumina, polyimide film and silicon wafer.

9. The method of claim 1, wherein said composition further comprises water or a liquid organic vehicle.

10. The method of claim 9, wherein the liquid organic vehicle is a mono- or polyhydroxy compound.

11. The method of claim 10, wherein the mono-or polyhydroxy compound is methanol, ethanol, isopropanol, glycerol, ethylene glycol, and polyethylene glycols.

12. The method of claim 1, wherein said laser beam is applied to said composition so as to produce conductive patterns of deposited metal having resolution in the area of one micron.

13. The method of claim 12, wherein said conductive patterns comprise lines of metal of said substrate of about 1 to about 20 microns width and about 3 to about 50 microns spacing between lines.

14. The method of claim 1, wherein said substrate comprises a printed circuit having patterns of conducting metal in need of repair because of cracks occurring in one or more portions of said patterns, said cracks being repaired by applying said laser beam to said composition in a manner that produces deposits of metal that bridge said cracks.

* * * * *